(12) United States Patent
Imai et al.

(10) Patent No.: US 10,256,107 B2
(45) Date of Patent: Apr. 9, 2019

(54) SUBSTRATE PROCESSING METHOD

(71) Applicant: TOKYO ELECTRON LIMITED, Tokyo (JP)

(72) Inventors: Muneyuki Imai, Yamanashi (JP); Satoshi Toda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/441,054

(22) Filed: Feb. 23, 2017

(65) Prior Publication Data
US 2017/0243753 A1 Aug. 24, 2017

(30) Foreign Application Priority Data

Feb. 24, 2016 (JP) ................. 2016-033294

(51) Int. Cl.
*H01L 21/3205* (2006.01)
*H01L 21/3105* (2006.01)
*H01L 21/311* (2006.01)
*H01L 21/762* (2006.01)
*H01J 37/32* (2006.01)
*H01L 21/67* (2006.01)
*H01L 21/677* (2006.01)
*H01L 21/687* (2006.01)

(52) U.S. Cl.
CPC ...... *H01L 21/31056* (2013.01); *H01J 37/321* (2013.01); *H01J 37/32422* (2013.01); *H01L 21/31116* (2013.01); *H01L 21/6719* (2013.01); *H01L 21/67742* (2013.01); *H01L 21/68742* (2013.01); *H01L 21/76205* (2013.01); *H01L 21/76224* (2013.01); *H01J 2237/334* (2013.01)

(58) Field of Classification Search
CPC ......... H01L 21/76224; H01L 21/31116; H01L 21/76025; H01L 21/3065; H01J 37/321
See application file for complete search history.

(56) References Cited

U.S. PATENT DOCUMENTS

| | | | | |
|---|---|---|---|---|
| 4,507,588 A * | 3/1985 | Asmussen | ............... | H01J 27/16 219/121.47 |
| 5,451,290 A * | 9/1995 | Salfelder | ............. | H01J 37/3244 216/67 |
| 5,731,241 A * | 3/1998 | Jang | .................. | H01L 21/76232 148/DIG. 50 |
| 6,204,193 B1 * | 3/2001 | Jozaki | ............... | H01L 21/31116 257/E21.252 |

(Continued)

FOREIGN PATENT DOCUMENTS

| JP | 2005-303247 | 10/2005 |
|---|---|---|
| KR | 2006-128673 A | 5/2006 |

(Continued)

*Primary Examiner* — Caridad Everhart

(57) ABSTRACT

There is disclosed a substrate processing method for etching a substrate on which a first and a second silicon oxide layer having different film qualities are formed side by side. The substrate processing method includes: a first etching step of supplying a halogen-containing gas that is not activated to the substrate and sublimating reaction by-products generated by reaction between the halogen-containing gas and the first and the second silicon oxide layer; and a second etching step of etching the substrate by radicals generated by activating the halogen-containing gas.

9 Claims, 9 Drawing Sheets

(56) References Cited

U.S. PATENT DOCUMENTS

| | | | |
|---|---|---|---|
| 7,141,504 B1 * | 11/2006 | Bhardwaj | B01J 12/007 438/700 |
| 2005/0227495 A1 | 10/2005 | Ryu | |
| 2010/0190345 A1 * | 7/2010 | Chen | H01L 21/31116 438/700 |
| 2013/0260533 A1 * | 10/2013 | Sapre | H01L 21/76224 438/435 |
| 2015/0340281 A1 * | 11/2015 | Lee | H01L 21/31116 438/5 |

FOREIGN PATENT DOCUMENTS

| | | |
|---|---|---|
| KR | 10-2011-0091779 A | 8/2011 |
| KR | 10-2015-0016490 A | 2/2015 |
| KR | 10-2016-0010344 A | 1/2016 |

* cited by examiner

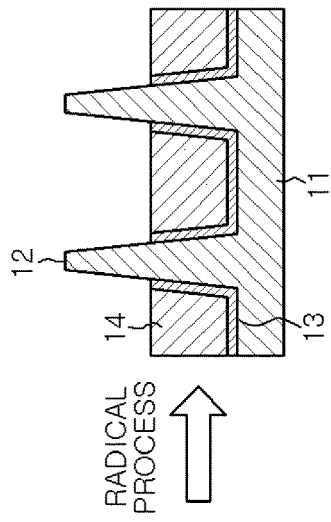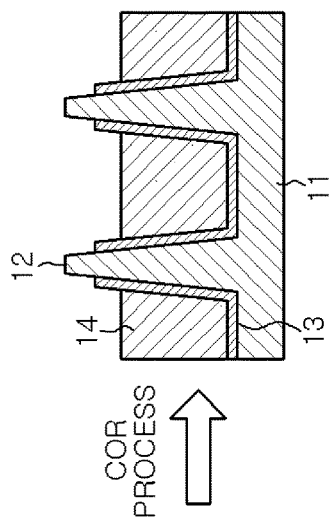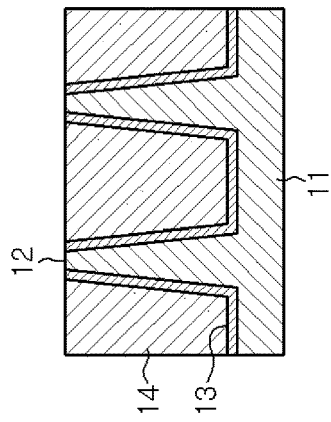

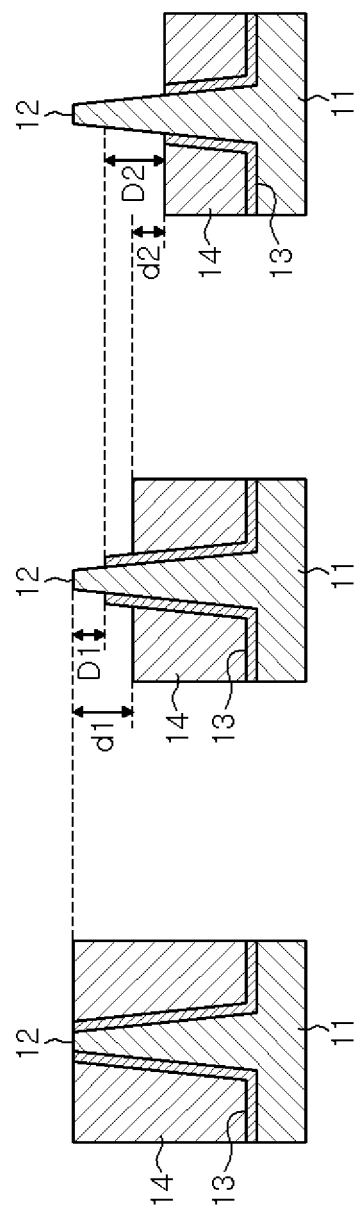

SUBSTRATE PROCESSING METHOD

CROSS-REFERENCE TO RELATED APPLICATIONS

This application claims priority to Japanese Patent Application No. 2016-033294 filed on Feb. 24, 2016, the entire contents of which is incorporated herein by reference.

FIELD OF THE INVENTION

The disclosure relates to a technique of etching a silicon oxide layer on a surface of a substrate by a processing gas.

BACKGROUND OF THE INVENTION

As semiconductor devices become various and three-dimensional, device structures become complicated and miniaturized. Accordingly, it is required to deal with various new surface structures and film qualities in a semiconductor manufacturing process. For example, in an etching process using a processing gas, chemical oxide removal (COR) is known as a technique capable of reducing damages to a substrate.

This technique is applied to, e.g., the case of etching a $SiO_2$ (silicon oxide) layer that is an insulating layer for isolating transistors. If a circuit pattern becomes complicated and three-dimensional, $SiO_2$ layers having different film qualities and used as etching target layers may be arranged on the surface of the substrate and etched. The $SiO_2$ layers have different film qualities due to different manufacturing methods. For example, the $SiO_2$ layers having different film qualities include a $SiO_2$ layer formed by CVD and a $SiO_2$ layer formed by oxidizing a Si (silicon) layer under an oxidizing atmosphere.

When the COR process is performed on the $SiO_2$ layers, the surface heights of the $SiO_2$ layers become non-uniform as the etching is performed. This is because their etching rates by the processing gas are different. Therefore, in the case of manufacturing a transistor by forming a gate electrode on the $SiO_2$ layers in a subsequent step, electrical characteristics may be adversely affected.

Japanese Patent Application Publication No. 2005-303247 discloses a method for etching an oxide film by using a gaseous mixture of $NF_3$ (nitrogen trifluoride) gas and He (helium) gas and removing impurities generated on a top surface of the oxide film due to F (fluorine) contained in the gaseous mixture by etching using a hydrogen plasma. Since, however, the disclosure of Japanese Patent Application Publication No. 2005-303247 is different in configuration from the present disclosure, it is difficult to achieve the objects of the present disclosure.

SUMMARY OF THE INVENTION

In view of the above, the disclosure provides a technique capable of adjusting surface heights of a first and a second silicon oxide layer having different film qualities after etching in the case of etching a substrate on which the first and the second silicon oxide layer are formed side by side.

In accordance with an aspect, there is provided a substrate processing method for etching a substrate on which a first and a second silicon oxide layer having different film qualities are formed side by side, the method including: a first etching step of supplying a halogen-containing gas that is not activated to the substrate and sublimating reaction by-products generated by reaction between the halogen-containing gas and the first and the second silicon oxide layer; and a second etching step of etching the substrate by radicals generated by activating the halogen-containing gas.

When the etching process is performed on the substrate on which the first and the second silicon oxide layer having different qualities are formed side by side, the first and the second etching step in which the etching selectivities for the first and the second silicon oxide film are different are performed. Accordingly, the etching rates of the first and the second silicon oxide layer are respectively controlled. As a result, the surface heights of the silicon oxide films after the etching can be adjusted.

BRIEF DESCRIPTION OF THE DRAWINGS

The objects and features of the disclosure will become apparent from the following description of embodiments, given in conjunction with the accompanying drawings, in which:

FIGS. 2A to 2C are view for explaining steps of an embodiment of a substrate processing method;

FIGS. 4A to 4C are vertical cross sectional side views showing operations of the substrate processing method;

DETAILED DESCRIPTION OF THE EMBODIMENTS

Figure 1:
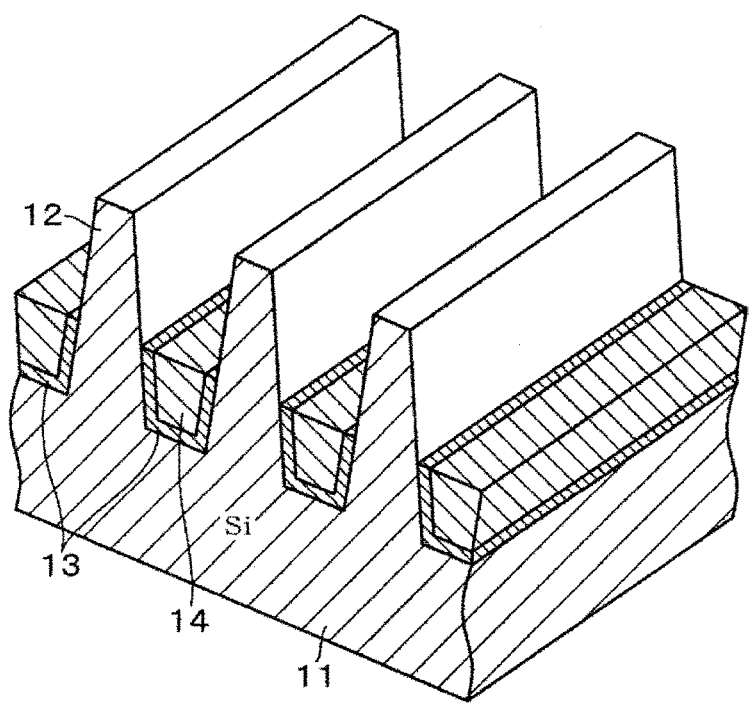
FIG. 1 is a partial perspective view showing a surface structure of a wafer as a substrate.

An embodiment in which the present disclosure is applied to a three-dimensional FET transistor manufacturing process will be described. FIG. 1 shows a surface structure of a gate portion of FET. A reference numeral 11 denotes a silicon substrate. A plurality of projecting walls 12 that is a silicon layer is formed in parallel on a surface of the silicon substrate while being spaced apart from each other at an interval. In FIG. 1, a reference numeral 13 denotes a first silicon oxide layer (first $SiO_2$ layer) coated on surfaces of the projecting walls 12 and a reference numeral 14 denotes a second silicon oxide layer (second $SiO_2$ layer) filled in spaces between the adjacent projecting walls 12.

The first $SiO_2$ layer 13 is a thermal oxide layer obtained by heating, e.g., a silicon layer under an oxidizing atmosphere. The second $SiO_2$ layer 14 is a silicon oxide layer formed by reaction between a raw material gas and an oxidizing gas by, e.g., a CVD (Chemical Vapor Deposition) method. Therefore, the first $SiO_2$ layer 13 has a film quality having less impurities and higher density compared to that of the second $SiO_2$ layer 14. In other words, the first and the second $SiO_2$ layer 13 and 14 have different film qualities.

Next, an etching process will be described with reference to FIGS. 2A to 4C. In a semiconductor wafer (hereinafter, referred to as "wafer") as a substrate before the etching process, the first SiO$_2$ layer 13 is formed to coat the surfaces of the projecting walls 12 of the silicon substrate 11 and, then, the second SiO$_2$ layer 14 is formed on the top surface of the first SiO$_2$ layer 13 to fill the spaces between the adjacent projecting walls 12. Next, the top surfaces of the first and the second SiO$_2$ layer 13 and are polished by CMP (Chemical Mechanical Polishing). Accordingly, top surfaces of the projecting walls 12 and the first and the second SiO$_2$ layer 13 and 14 have the same height as can be seen from FIG. 2A.

A first etching step is performed on the wafer W. In the first etching step, the first and the second SiO$_2$ layer 13 and 14 are etched by, e.g., a COR process, without using a plasma. The COR process is performed by supplying a processing gas containing a halogen-containing gas, e.g., HF (hydrogen fluoride) gas, and NH$_3$ (ammonia) gas to the wafer W and sublimating reaction by-products generated by reaction between the processing gas and the SiO$_2$ layers. Specifically, a COR processing apparatus to be described later supplies the processing gas containing HF gas and NH$_3$ gas into the processing chamber in a state that a processing chamber where the wafer W is accommodated is set to a low pressure state close to a vacuum state and the wafer W is heated to a temperature of, e.g., 25° C. to 150° C. Accordingly, the first and the second SiO$_2$ layer 13 and 14 chemically react with HF molecules and NH$_3$ molecules, thereby generating reaction by-products such as (NH$_4$)$_2$SiF$_6$ (ammonium fluorosilicate), H$_2$O (water) and the like. Since the wafer W is heated to a temperature higher than a sublimation temperature of the reaction by-products, the reaction by-products are removed by sublimation. In this manner, the first and the second SiO$_2$ layer 13 and 14 are etched.

The first SiO$_2$ layer 13 has a higher density and higher activation energy than those of the second SiO$_2$ layer 14. Therefore, in the COR process in which the SiO$_2$ layers react with the processing gas, an etching rate and reactivity of the second SiO$_2$ layer 14 with the NH$_3$ gas and the HF gas are higher than those of the first SiO$_2$ layer 13. In the first etching step in which the COR process is performed, the etching is performed under a condition that an etching rate of the first SiO$_2$ layer 13 is lower than an etching rate of the second SiO$_2$ layer 14.

Figure 3A:
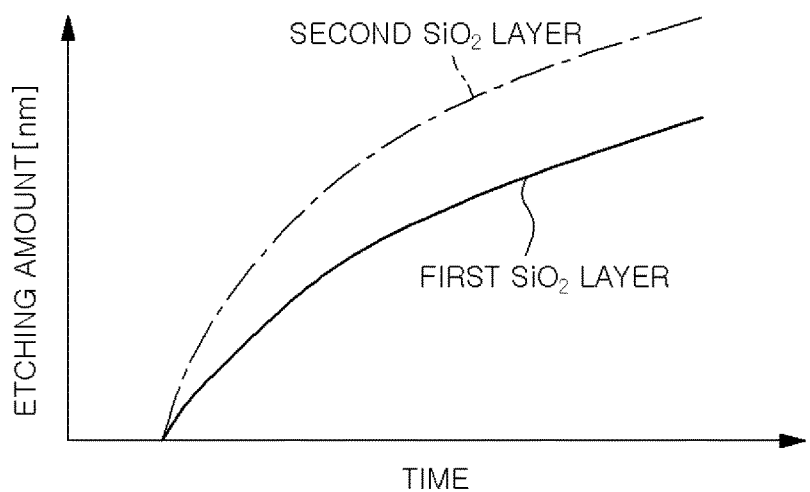
FIGS. 3A and 3B are characteristic views showing relation between etching amount and time.
Figure 3B:
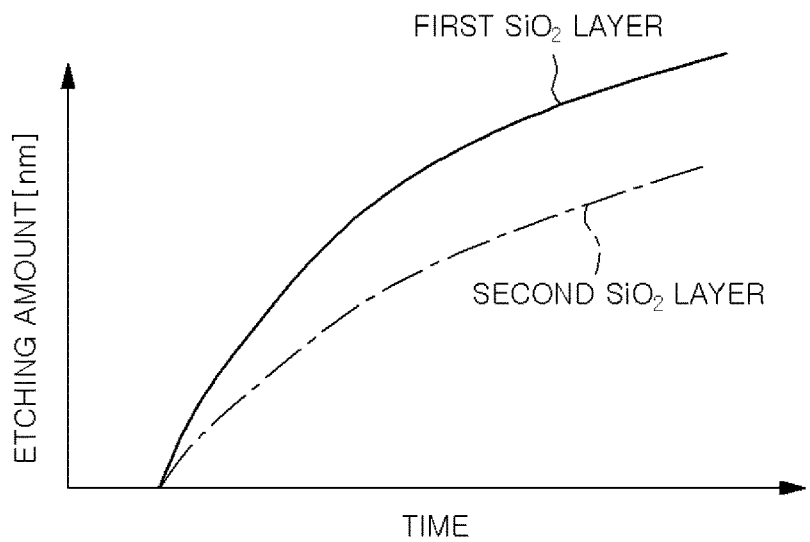

Therefore, by performing the COR process, an etching amount of the second SiO$_2$ layer 14 becomes greater than that of the first SiO$_2$ layer 13 as shown in FIG. 3A. After the COR process is performed for a predetermined period of time, the first SiO$_2$ layer 13 is exposed from the surface of the second SiO$_2$ layer 14 as shown in FIG. 2B. In FIGS. 3A and 3B, the horizontal axis indicates time and the vertical axis indicates an etching amount. The etching amount indicates an etched depth from the top surfaces of the first and the second SiO$_2$ layer 13 and 14.

Upon completion of the first etching step, the second etching step is performed. In the second etching step, the etching is performed by radicals obtained by activating a halogen-containing gas, e.g., a gaseous mixture of NF$_3$ gas and NH$_3$ gas. A plasma obtained by activating the gaseous mixture passes through, e.g., a conductive ion trap member so that ions are removed therefrom and the plasma containing mainly radicals as active species is supplied to the wafer W. In other words, in the second etching step, a radical process in which the SiO$_2$ layers are etched by radicals is performed by, e.g., a radical processing apparatus to be described later.

When the gaseous mixture of NF$_3$ gas and NH$_3$ gas is activated, it is expected that a plasma containing F radicals, N radicals, and ion components of NH$_3$ or NH$_4$F is generated by the following reaction formulars (1) and (2).

$$NF_3 + NH_3 + e \rightarrow 3F^* + 2N^* + 3H^* \tag{1}$$

$$F^* + N^* + 4H^* \rightarrow NH_4F \tag{2}$$

The ion components are removed from the plasma while the plasma passes through the ion trap member. The first and the second SiO$_2$ layers 13 and 14 are etched by the plasma containing F radicals (F*) and N radicals (N*). The SiO$_2$ layers are etched mainly by the F radicals contained in the plasma. It is expected that the SiO$_2$ layers are etched by the following reaction formulars (3) and (4).

$$NF_3 + 3NH_3 \rightarrow NH_4F + N_2 \tag{3}$$

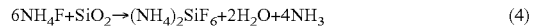

$$6NH_4F + SiO_2 \rightarrow (NH_4)_2SiF_6 + 2H_2O + 4NH_3 \tag{4}$$

In the radical process, the first and the second SiO$_2$ layer 13 and 14 generate the reaction by-products such as (NH$_4$)$_2$SiF$_6$, H$_2$O and the like. The etching is performed by sublimating and removing the reaction by-products by radical energy. In the radical process, an etching rate of the first SiO$_2$ layer 13 is higher than that of the second SiO$_2$ layer 14. This is considered because the energy of radical species is greater than the activation energy of the first SiO$_2$ layer 13 and, thus, the etching of the first SiO$_2$ layer 13 proceeds quickly.

Therefore, in the second etching step in which the radical process is performed, the etching is performed under the condition that the etching rate of the second SiO$_2$ layer is lower than that of the first SiO$_2$ layer 13. Accordingly, by performing the radical process, as shown in FIG. 3B, the etching amount of the first SiO$_2$ layer 13 becomes greater than that of the second SiO$_2$ layer 14, and the top surface height of the first SiO$_2$ layer 13 becomes gradually close to that of the second SiO$_2$ layer 14.

As described above, in the first etching step, the etching rate of the second SiO$_2$ layer 14 is greater than that of the first SiO$_2$ layer 13. In the second etching step, the etching rate of the first SiO$_2$ layer 13 is greater than that of the second SiO$_2$ layer 14. Therefore, by setting the etching conditions, the top surfaces of the first and the second SiO$_2$ layer 13 and 14 can have the same height when the first and the second etching step are completed, as can be seen from FIG. 2C.

Specifically, in the first and the second etching step, the etching rates of the first and the second SiO$_2$ layer 13 and 14 vary depending on types or flow rates of a processing gas, a pressure in the processing chamber, a wafer temperature, an etching time, or the like. Thus, in each of the first and the second etching step, a flow rate of the processing gas, a pressure in the processing chamber, a wafer temperature are set in advance depending on the type of the processing gas, and the etching rate of each of the first and the second SiO$_2$ layer 13 and 14 is obtained. The etching time of each of the first and the second etching step is adjusted such that the top surfaces of the first and the second SiO$_2$ layer 13 and 14 have the same height when the first and the second etching step are completed.

FIG. 4A shows a surface structure of the wafer W before the COR process. FIG. 4B shows a surface structure of the wafer W after the COR process. FIG. 4C shows a surface structure of the wafer W after the radical process. An etching amount of the first SiO$_2$ layer 13 by the COR process is indicated as D1. An etching amount of the second SiO$_2$ layer 14 by the COR process is indicated as d1. An etching amount of the first SiO$_2$ layer 13 by the radical process is indicated as D2. An etching amount of the second SiO$_2$ layer 14 is indicated as d2. A thickness of the SiO$_2$ layers etched by the amount of (D1+D2) is a target thickness.

Therefore, the processing time of the COR process (first etching step) and that of the radical process (second etching step) are determined such that the top surfaces of the first and the second SiO$_2$ layer 13 and 14 have the same height, i.e., such that the relation of (D1+D2)=(d1+d2) is satisfied, when the SiO$_2$ films are etched until the target thickness is obtained. Upon completion of the first and the second etching step, a gate electrode is formed and a gate portion of FET of a three-dimensional device structure is manufactured.

Figure 5:
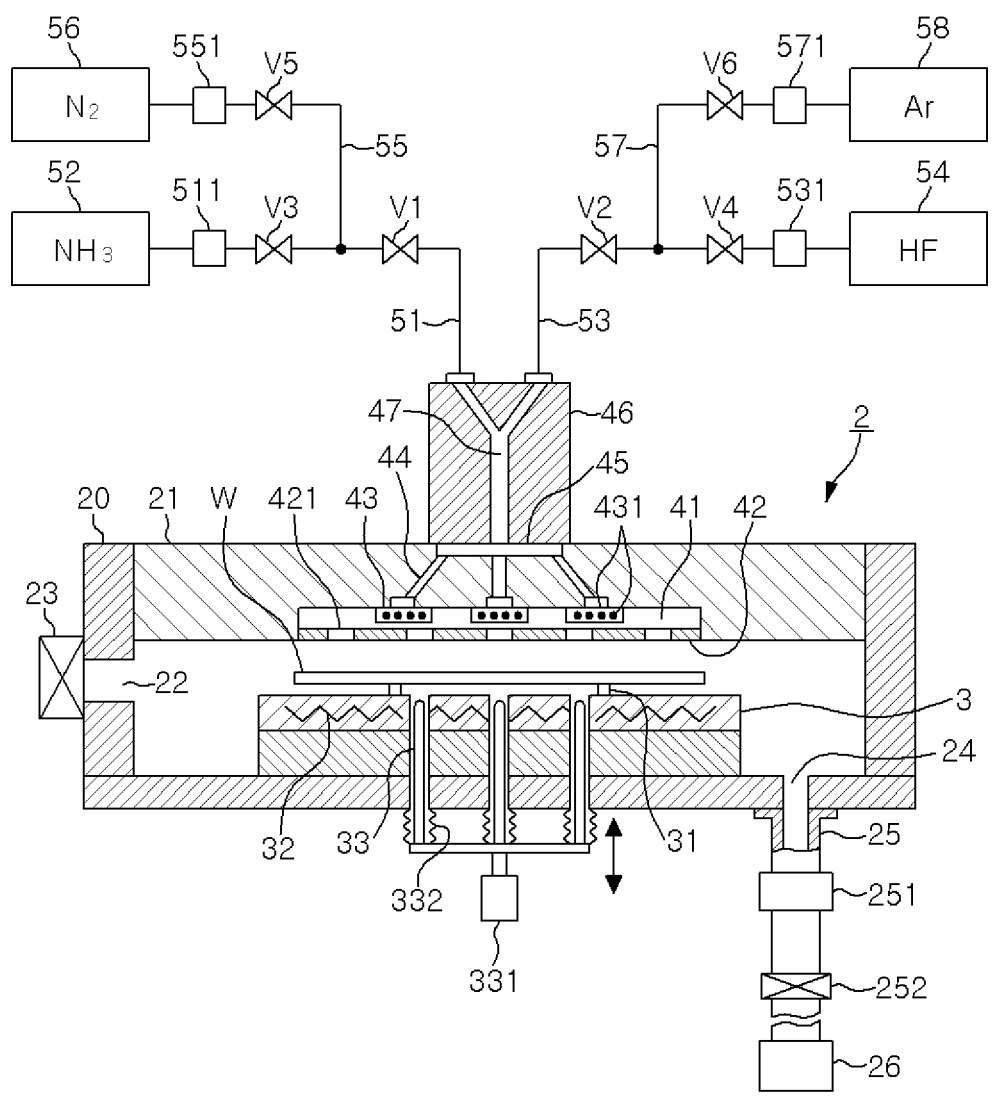
FIG. 5 is a vertical cross sectional side view showing an embodiment of a COR processing apparatus for performing a first etching step.

Next, an apparatus for performing the first and the second etching step will be described. First, an embodiment of the COR processing apparatus 2 for performing the first etching step will be described with reference to FIG. 5. In FIG. 5, a reference numeral 20 denotes a processing chamber, e.g., a cylindrical vacuum chamber; a reference numeral 21 denotes a top plate; a reference numeral 22 denotes a loading/unloading port of a wafer; a reference numeral 23 denotes a gate valve. A mounting unit 3 is provided in the processing chamber 20. The wafer W is supported on support pins 31 of the mounting unit 3. A heating unit 32 is provided in the mounting unit 3. Thrust pins 33 for delivering the wafer W are vertically movable by an elevation unit 331. A reference numeral 332 denotes a bellows. A gas exhaust port 24 formed at a bottom surface of the processing chamber 20 is connected to a vacuum exhaust pump 26 serving as a vacuum exhaust unit via a gas exhaust line 25 in which a pressure control valve 251 and an opening/closing valve 252 are installed.

A recess 41 is formed at a central region of a bottom surface of the top plate 21. A diffusion plate 42 having gas supply holes 421 arranged in a matrix shape covers the recess 41 while facing the mounting unit 3. In FIG. 5, a reference numeral 43 denotes a plurality of flat cylindrical gas diffusion units spaced apart from each other at a regular interval in, e.g., a circumferential direction. A reference numeral 431 denotes a plurality of gas injection holes formed at side surfaces of the gas diffusion units 43. A reference numeral 44 denotes internal channels formed in the top plate 21. A reference numeral 45 denotes a diffusion space for diffusing a gas. The internal channels are connected to the diffusion space 45. A reference numeral 46 denotes a projecting structure. Formed in the projecting structure 46 is an external channel 47 having an upper end branched into two lines and a lower end that opens to the diffusion space.

One of the branch lines of the external channel 47 is connected to an NH$_3$ gas supply source 52 through an NH$_3$ gas supply line 51 in which a valve V1, a valve V3, a flow rate controller 511 are installed from a downstream side. The other branch line is connected to a HF gas supply source 54 through a HF gas supply line 53 in which a valve V2, a valve V4, a flow rate controller 531 are installed from a downstream side. A portion between the valve V1 and V3 in the NH$_3$ gas supply line 51 is connected to a gas supply source 56 for supplying N$_2$ gas as a carrier gas through a supply line 55 in which a flow rate controller 551 and a valve V5 are installed. A portion between the valves V2 and V4 in the HF gas supply line 53 is connected to a supply source 58 for supplying Ar gas as a carrier gas through a supply line 57 in which a flow rate controller 571 and a valve V6 are installed.

In the COR processing apparatus 2, the wafer W is mounted on the mounting unit 3 by a cooperative operation of, e.g., an external transfer arm (not shown) and the thrust pins 33, and heated by the heating unit 32 to a temperature of, e.g., 25° C. to 150° C. Then, N$_2$ gas and Ar gas, for example, are supplied. The N$_2$ gas and the Ar gas are mixed in the external channel 47. The mixed gas is diffused from the diffusion space 45 into the internal channels 44 and then radially injected into the recess 41 from the injection holes 431 of the gas diffusion units 43. The gas diffused into the recess 41 is discharged into the processing chamber 20 through the gas supply holes 421 of the diffusion plate 42.

Next, NH$_3$ gas and HF gas are supplied. The NH$_3$ gas and the HF gas are mixed in the external channel 47 and the mixed gas serves as a processing gas. The processing gas is injected together with the N$_2$ gas and the Ar gas into the processing chamber 20 from the gas supply holes 421 through the recess 41. Accordingly, the processing gas containing the NH$_3$ gas and the HF gas is supplied to the wafer W, and reaction by-products are generated by reaction between the processing gas and the first and the second SiO$_2$ layer 13 and 14 on the wafer W. Since the wafer W is heated to a temperature higher than the sublimation temperature of the reaction by-products, the reaction by-products are quickly sublimated and discharged together with the processing gas from the processing chamber 20 through the gas exhaust port 24.

After the COR process is performed for a predetermined period of time, the supply of the NH$_3$ gas and the HF gas is stopped. Then, after a predetermined period of time elapses, the supply of the N$_2$ gas and the Ar gas is stopped. Next, the wafer W is unloaded from the processing chamber 20 and transferred to, e.g., a heating module. The wafer W is heated to a temperature higher than the sublimation temperature of reaction by-products. As a consequence, the reaction by-products are sublimated further.

Figure 6:
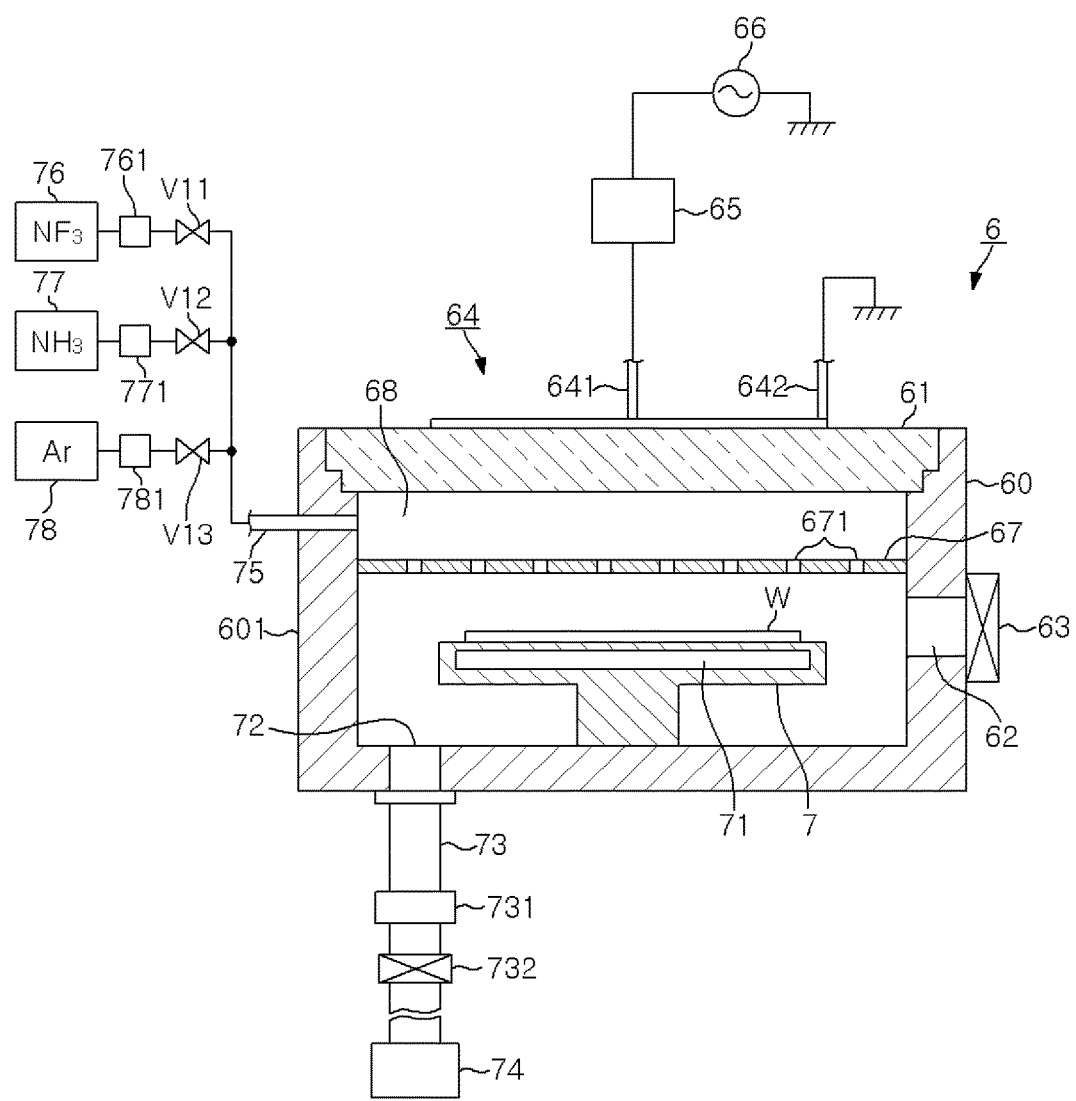
FIG. 6 is a vertical cross sectional side view showing an embodiment of a radical processing apparatus for performing a second etching step.

Next, an embodiment of the radical processing apparatus 6 for performing the second etching step will be described with reference to FIG. 6. In FIG. 6, a reference numeral 60 denotes a processing chamber, e.g., a vacuum chamber. A reference numeral 61 denotes a transmitting plate made of, e.g., quartz. A reference numeral 62 denotes a loading/unloading port for a wafer. A reference numeral 63 denotes a gate valve. A mounting unit 7 for mounting thereon the wafer W is provided in the processing chamber 60. A temperature control channel 71 is formed in the mounting unit 7 and configured to control a temperature of the wafer W heated by a plasma to be described later to, e.g., 10° C. to 120° C. Thrust pins for delivering the wafer W and an elevation unit of the thrust pins are not illustrated. A gas exhaust port 72 formed at a bottom surface of the processing chamber 60 is connected to a vacuum exhaust pump 74 serving as a vacuum exhaust unit through a gas exhaust line 73 in which a pressure control valve 731 and an opening/closing valve 732 are installed.

An ICP antenna unit 64 constituting a plasma generation unit is provided at an upper side of the transmitting plate 61. The ICP antenna unit 64 is configured as, e.g., a spiral antenna formed by winding a conductive member in a planar spiral shape. One end 641 of the ICP antenna unit 64 is connected to a high frequency power supply 66 via a matching circuit 65. The other end 642 of the ICP antenna unit 64 is grounded. A conductive ion trap plate 67 is provided below the transmitting plate 61 to face the transmitting plate 61. A plasma generation space 68 is generated between the ion trap plate 67 and the transmitting plate 61. A plurality of gas through holes 671 is formed in the ion trap plate 67.

For example, a gas supply line 75 for supplying a gas to the plasma generation space 68 is provided at a sidewall of the processing chamber 60. The gas supply line 75 is connected to an $NF_3$ gas supply source 76 through a valve V11 and a flow rate controller 761 and also connected to an $NH_3$ gas supply source 77 through a valve V12 and a flow rate controller 771. The gas supply line 75 is also connected to an Ar gas supply source 78 for supplying Ar gas as an additional gas through a valve V13 and a flow rate controller 781.

In the radical processing apparatus 6, the wafer W is mounted on the mounting unit 7 by a cooperative operation of an external transfer arm (not shown) and the thrust pins. A temperature of the wafer W is controlled to, e.g., 10° C. to 120° C. by circulating temperature control fluid in the temperature control channel 71. A pressure in the processing chamber 60 is controlled to, e.g., 13.3 Pa to 399 Pa (100 mTorr to 3000 mTorr). A high frequency power of, e.g., 100 W to 1200 W, is supplied from the high frequency power supply 66 to the ICP antenna unit 641. $NF_3$ gas, $NH_3$ gas and Ar gas are mixed in the gas supply line 75 and the mixed gas is supplied into the plasma generation space 68. Flow rates of the $NF_3$ gas and the $NH_3$ gas are set within a range from, e.g., 50 sccm to 2000 sccm. A flow rate of Ar gas is set within a range from, e.g., 50 sccm to 2000 sccm.

In the plasma generation space 68, the supplied gas is activated by an ICP plasma generated below the transmitting plate 61. The ICP plasma moves toward the mounting unit 7 through the gas through holes 671 of the ion trap plate 67. Ion components in the plasma are removed while the plasma passes through the ion trap plate 67. Accordingly, the wafer W in the processing chamber 60 is etched by the plasma of which active species are mainly radicals. The first and the second $SiO_2$ layer 13 and 14 on the wafer W mainly react with F radicals, thereby generating reaction by-products. The reaction by-products thus generated are sublimated by radical energy and discharged through the gas exhaust port 72. After the radical process is performed for a predetermined period of time, e.g., 10 sec to 180 sec, the supply of the high frequency power from the high frequency power supply 66 and the supply of the $NF_3$ gas, the $NH_3$ gas and the Ar gas are stopped. Then, the wafer W is unloaded from the processing chamber 60.

Figure 7:
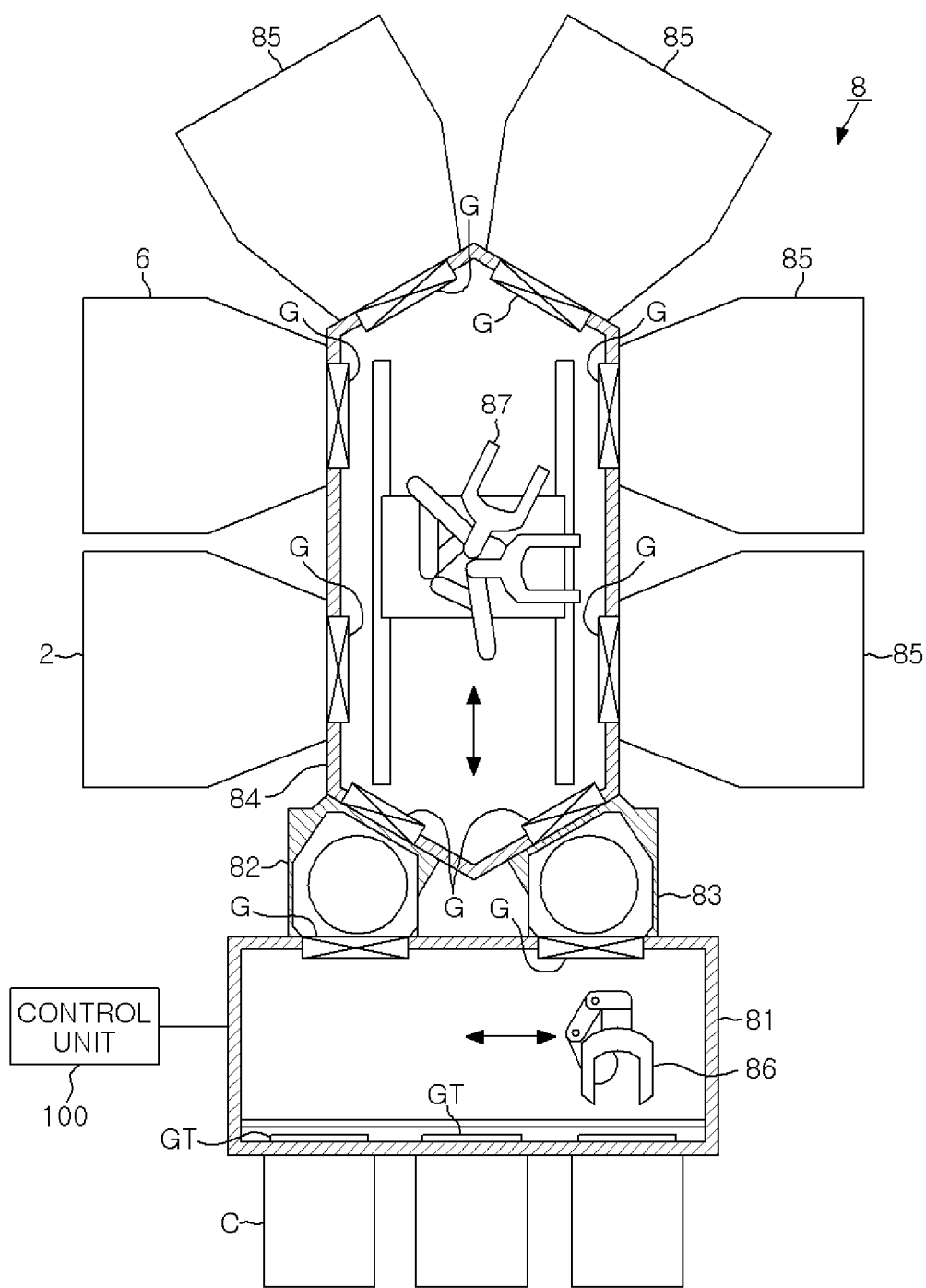
FIG. 7 is a top view showing an embodiment of a semiconductor manufacturing apparatus including the COR processing apparatus and the radical processing apparatus.

Hereinafter, a semiconductor device manufacturing system 8 including the COR processing apparatus 2 and the radical processing apparatus 6 will be briefly described with reference to FIG. 7. The semiconductor manufacturing system 8 includes an atmospheric transfer chamber 81 for loading/unloading the wafer W, load-lock chambers 82 and 83 whose inner space can be switched between an atmospheric atmosphere and a vacuum atmosphere, and a vacuum transfer chamber 84. The vacuum transfer chamber 84 is airtightly connected to the COR processing apparatus 2, the radical processing apparatus 6, and the substrate processing apparatuses 85 such as the heating module and the like. A first and a second transfer unit 86 and 87 are provided in the atmospheric transfer chamber 81 and the vacuum transfer chamber 84, respectively. A notation C in FIG. 7 indicates carriers where wafers W are accommodated. A notation G indicates gate doors. Each of the carriers C accommodates therein wafers W having a surface structure shown in FIG. 2A.

The semiconductor manufacturing system 8 includes a control unit 100, e.g., a computer. The control unit 100 includes a data processing unit having a program, a memory, a CPU, and the like. The program includes commands (steps) for sending control signals to the respective components of the semiconductor manufacturing system 8 from the control unit 100 and executing the step of performing the COR process or the radical process. The program is stored in a storage unit of a computer storage medium, e.g., a flexible disk, a compact disk, a hard disk, an MO (magneto-optical disk) or the like, and installed in the control unit 100.

In the semiconductor manufacturing apparatus 8, a wafer W in the carrier C is transferred to, e.g., a load-lock chamber 82 in an atmospheric atmosphere, by the first transfer unit 86 through the atmospheric transfer chamber 81 and, then, the inner space of the load-lock chamber 82 is switched to a vacuum atmosphere. Next, the wafer W is transferred to the COR processing apparatus 2 by the second transfer unit 87 and the above-described COR process (first etching step) is performed. Thereafter, the wafer W is transferred to, e.g., the heating module 85, by the second transfer unit 87 and reaction by-products are further sublimated by heating the wafer W. Next, the wafer W is transferred to the radical processing apparatus 6 by the second transfer unit 87 and the above-described radical process (second etching step) is performed. The wafer W having the first and the second $SiO_2$ layer 13 and 14 etched is transferred to, e.g., the load-lock chamber 83 in a vacuum atmosphere, by the second transfer unit 87. Then, the inner space of the load-lock chamber 83 is switched to an atmospheric atmosphere. Thereafter, the wafer W is returned to, e.g., the original carrier C, by the first transfer unit 86.

The present disclosure has been conceived by discovering that the etching selectivity of the first and the second $SiO_2$ layer 13 and 14 in the COR process is opposite to that in the radical process in the case of etching the wafer W on which the first and the second $SiO_2$ layer 13 and 14 having different film qualities are formed side by side.

Therefore, in the above embodiment, the COR process (first etching step) in which the etching rate of the second $SiO_2$ layer 14 is higher than that of the first $SiO_2$ layer 13 and the radical process (second etching step) in which the etching rate of the first $SiO_2$ layer 13 is higher than that of the second $SiO_2$ layer 14 are performed. Accordingly, the surface heights of the $SiO_2$ layers after the etching can be adjusted by controlling the etching rates of the first and the second $SiO_2$ layer 13 and 14.

Therefore, by controlling the processing time of the first and the second etching step, the surface heights of the first and the second $SiO_2$ layer 13 and 14 after the etching can be adjusted to be the same when the first and the second etching step are completed. Accordingly, in the case where the first $SiO_2$ layer 13 is a thermal oxide film that coats the projecting walls 12 and the second $SiO_2$ layer 14 is a $SiO_2$ film that is formed by CVD to fill the spaces between the projecting walls 12, predetermined electrical characteristics can be obtained when a gate electrode is formed by laminating a gate oxide film in subsequence steps. In addition, gates provided at both sides of the projecting walls 12 can have the same length, so that variation of the electrical characteristics of the transistor can be suppressed.

In the first etching step, vapor of ethanol ($C_2H_5OH$), steam ($H_2O$) or the like may be used instead of $NH_3$ gas used as the processing gas. The first etching step can be performed by using a processing gas containing a compound of nitrogen, hydrogen and fluorine instead of the processing gas containing HF gas and $NH_3$ gas. For example, the first etching step can be performed by using ammonium fluoride ($NH_4F$) gas. In that case, $(NH_4)_2SiF_6$ is generated by reaction between the $NH_4F$ gas and the $SiO_2$ films. Further, the first etching step may be performed by supplying to the wafer W both of the processing gas containing HF gas and $NH_3$ gas and the processing gas containing a compound of nitrogen, hydrogen and fluorine.

In the example, a gas containing fluorine as halogen is exemplified as the processing gas. However, a processing gas containing boron (Br) instead of fluorine may be used. Specifically, HBr gas may be used instead of HF gas, and NH₄Br gas may be used instead of NH₄F gas.

In the first etching step, in the COR processing apparatus, the processing gas may be made to react with the SiO₂ layers at a room temperature and, then, the wafer W may be transferred to the heating chamber to sublimate reaction by-products. Or, in the COR processing apparatus, reaction by-products may be generated and sublimated by reaction between the processing gas and the SiO₂ layers at an appropriate high temperature (at which the reaction by-products are sublimated). Or, in the COR processing apparatus, reaction by-products may be generated and sublimated by reaction between the processing gas and the SiO₂ layers at the appropriate high temperature and, then, the wafer W may be transferred to the heating chamber and heated to further sublimate the reaction by-products.

The second etching step may be performed by using a gaseous mixture of HF gas and NH₃ gas or a gaseous mixture of ClF₃ gas and NH₃ gas, instead of the gaseous mixture of NF₃ gas and NH₃ gas. In that case, a plasma of which active species are mainly F radicals is obtained, and the wafer W is etched by the plasma thus obtained based on, e.g., the following reaction formulars. (5) and (6).

$$SiO_2 + 4HF \rightarrow SiF_4 + 2H_2O \quad (5)$$

$$SiF_4 + 2NH_3 + 2HF \rightarrow (NH_4)_2SiF_6 \quad (6)$$

NF₃ gas or HF gas may be mixed with vapor of ethanol, steam or the like, other than NH₃ gas.

In the above embodiment, the second etching step is performed after the first etching step. However, the second etching step may be performed before the first etching step.

In the present disclosure, the COR process as the first etching step and the radical process as the second etching step may be performed by the same apparatus. For example, a heating unit is provided at the mounting unit 7 of the radical processing apparatus shown in FIG. 6, and a gas supply line for supplying, e.g., HF gas and NH₃ gas, is provided below the plasma generation space 68 or the ion trap plate 67. The first etching step is performed by supplying HF gas and NH₃ gas to the wafer W mounted and heated on the mounting unit 7 and sublimating reaction by-products generated by reaction between the gases and the SiO₂ layers. Next, the second etching step may be performed in the above-described manner.

Test Example

A test example that has been performed to examine the effect of the embodiment of the present disclosure will be described.

A wafer having a surface structure shown in FIG. 2A after the COR process (first etching step) was subjected to a radical process (second etching step) by using a gaseous mixture of NF₃ gas and NH₃ gas by the radical processing apparatus shown in FIG. 6. The etching conditions at this time were as follows.

Figure 8:
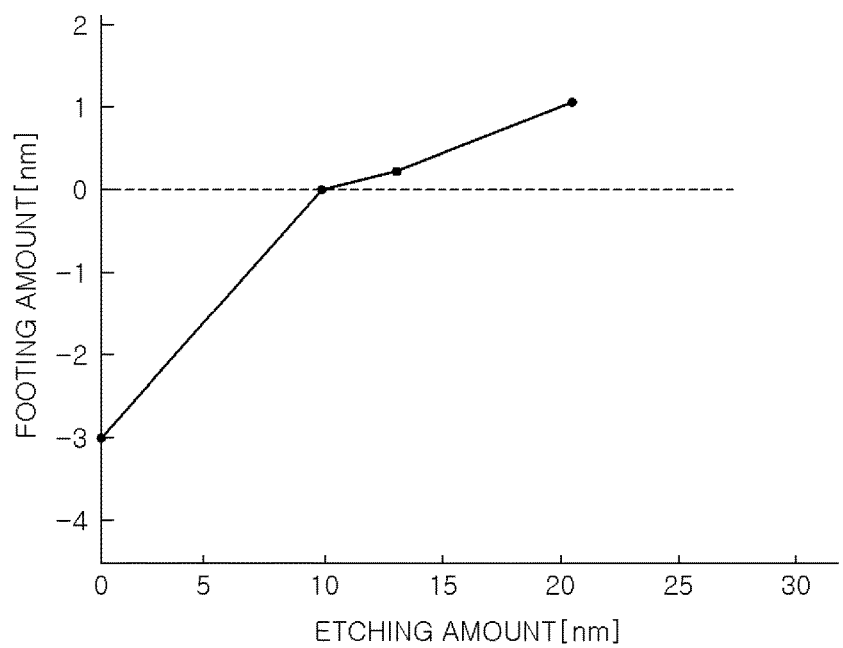
FIG. 8 is a characteristic view showing relation between etching amount and footing amount in a radical process.
Figure 9A:
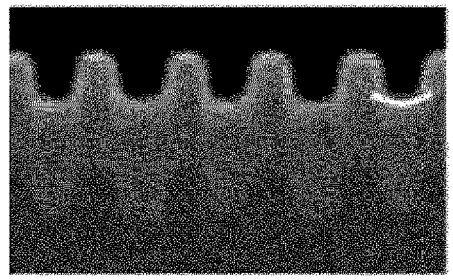
FIGS. 9A to 9C show SEM images of a wafer surface after etching.
Figure 9B:
Figure 9C:
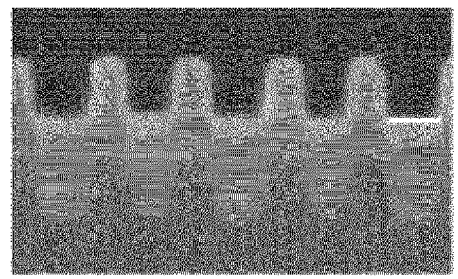

Temperature of the wafer W: 25° C. to 150° C.
NF₃ gas flow rate: 50 sccm to 500 sccm
NH₃ gas flow rate: 100 sccm to 1000 sccm
Ar gas flow rate: 50 sccm to 500 sccm
Pressure in the processing chamber: 30 Pa to 200 Pa
High frequency power: 100 W to 1200 W After the radical process was performed for a predetermined period of time, the surface structure of the wafer W was monitored at predetermined timing by an SEM (scanning electron microscope). FIG. 8 shows relation between an etching amount (etched depth) and a footing amount in the radical process. FIGS. 9A to 9C show SEM images. The footing amount is an index of a shape after etching. A minus footing amount indicates a downwardly projecting curved shape. A plus footing amount indicates an upwardly projecting curved shape. The SEM images in FIGS. 9A to 9C show a state before the radical process, a state in which an etching amount is 10.2 nm (radical processing time of 7 sec), and a state in which an etching amount is 13.6 nm (radical processing time of 12 sec), respectively.

As a result, when the etching amount was 0, i.e., before the radical process was performed, the footing amount was −3 and the etching shape was a downwardly projecting curved shape as shown in the SEM image. The downwardly projecting curved shape is obtained because a surface height of the first layer 13 is higher than that of the second layer 14 and, thus, a surface height of a region far from the projecting walls 12 becomes lower than that of a region close to the projecting walls 12. This has proven that the etching amount of the second SiO₂ layer 14 by the COR process is greater than that of the first SiO₂ layer 13 by the COR process. Further, it has been confirmed from the SEM image that as the radical process progresses, the first and the second SiO₂ layer 13 and 14 are etched and the etching shape is planarized. The planarization of the etching shape indicates that the surface height of the first SiO₂ layer 13 becomes equal to that of the second SiO₂ layer 14. In other words, the etching amount of the first SiO₂ layer 13 by the radical process is greater than that of the second SiO₂ layer 14 by the radical process.

When the etching amount was 13.6 nm, the etching shape was considerably flat. However, as the radical process progresses, the etching shape becomes an upwardly projecting curved shape. The upwardly projecting curved shape is obtained because the first SiO₂ layer 13 is excessively etched and, thus, the surface height of the first SiO₂ layer 13 becomes lower than that of the second SiO₂ layer 14 and a surface height of a region far from the projecting walls 12 becomes higher.

From the above, it has been confirmed that the surface heights of the SiO₂ layers can be adjusted by controlling the etching rates of the first and the second SiO₂ layer 13 and 14 by combining the COR process and the radical process. Further, the surface heights of the SiO₂ layers can be adjusted to be the same by adjusting the processing time of the COR process and that of the radical process.

While the disclosure has been shown and described with respect to the embodiments, it will be understood by those skilled in the art that various changes and modifications may be made without departing from the scope of the disclosure as defined in the following claims.

What is claimed is:

1. A substrate processing method for etching a substrate on which a first and a second silicon oxide layer having different film qualities are formed side by side, the method comprising:
    a first etching step of supplying a halogen-containing gas that is not activated to the substrate and sublimating reaction by-products generated by reaction between the halogen-containing gas and the first and the second silicon oxide layer; and
    a second etching step of etching the substrate by radicals generated by activating the halogen-containing gas,
    wherein processing time of the first etching step and processing time of the second etching step are set such that a surface height of the first silicon oxide layer becomes equal to a surface height of the second silicon oxide layer when the first etching step and the second etching step are completed.

2. The substrate processing method of claim 1, wherein a plasma containing the radicals passes through an ion trap member having a plurality of gas through holes and then is supplied to the substrate.

3. The substrate processing method of claim 1, wherein the first silicon oxide layer is a thermal oxide layer obtained by heating a silicon layer under an oxidizing atmosphere.

4. The substrate processing method of claim 1, wherein the second silicon oxide layer is a silicon oxide layer formed by reaction between a raw material gas and an oxidizing gas.

5. The substrate processing method of claim 1, wherein a plurality of projecting walls spaced apart from each other is arranged in parallel on a surface of the substrate,
wherein the first silicon oxide layer is a thermal oxide layer obtained by heating a silicon layer under an oxidizing atmosphere and is a coating layer coated on surfaces of the projecting walls, and
wherein the second silicon layer is a silicon oxide layer formed by reaction between a raw material gas and an oxidizing gas and fills spaces between the adjacent projecting walls.

6. The substrate processing method of claim 1, wherein the first etching step and the second etching step are performed as a separate step.

7. The substrate processing method of claim 1, wherein the second etching step are performed after the first etching step has been completed.

8. The substrate processing method of claim 1, wherein the first and the second silicon oxide layer are at least partially removed by the second etching step.

9. The substrate processing method of claim 1, wherein the first etching step is performed under a condition that an etching rate of the first silicon oxide layer is lower than an etching rate of the second silicon oxide layer, and the second etching step is performed under a condition that the etching rate of the second silicon oxide layer is lower than the etching rate of the first silicon oxide layer.

* * * * *